United States Patent [19]

Nakamura

[11] Patent Number: 5,259,919
[45] Date of Patent: Nov. 9, 1993

[54] METHOD OF MANUFACTURING MONOCRYSTALS OF OXIDE

[75] Inventor: Kozo Nakamura, Hiratsuka, Japan

[73] Assignee: Kabushiki Kaisha Komatsu Seisakusho, Japan

[21] Appl. No.: 776,339

[22] PCT Filed: Apr. 17, 1991

[86] PCT No.: PCT/JP91/00510

§ 371 Date: Dec. 13, 1991

§ 102(e) Date: Dec. 13, 1991

[87] PCT Pub. No.: WO91/16477

PCT Pub. Date: Oct. 31, 1991

[30] Foreign Application Priority Data

Apr. 17, 1990 [JP] Japan .................... 2-100834

[51] Int. Cl.⁵ .................................. C30B 15/30
[52] U.S. Cl. ......................... 156/617.1; 156/618.1; 156/620.2; 156/620.5; 156/DIG. 63
[58] Field of Search ............. 156/617.1, 618.1, 620.2, 156/620.5, DIG. 63

[56] References Cited

FOREIGN PATENT DOCUMENTS 3-199199 8/1991 Japan ...................... 156/620.5
WO90/07591 7/1990 PCT Int'l Appl.
WO90/04857 5/1990 World Int. Prop. O.

OTHER PUBLICATIONS

"Physical Properties of Magnetic 2-D Oxides Containing $Cr^{3+}$, $(SrCaR)_2(Cr_xGa_{1-x})O_4$, (R=La or Sm)." Journal of the Physical Society of Japan, vol. 44, No. 4, 1978, pp. 1083-1090.

"Key to the World's Chemical Literature," Chemical Abstracts, vol. 88, No. 26, 1978, p. 740.

Primary Examiner—Robert Kunemund

[57] ABSTRACT

As a melt of a raw material $SrLaGaO_4$ is used as shown by the following formula and a monocrystal is obtained by Czochralski pulling method.

$$Sr_xLa_yGa_zO_w$$

where $z \geqq x$, $y \geqq x$ and $0.28 \leqq x \leqq 0.325$ $x+y+z=1$ $w=(2x-3y+3z)/2$ Preferably, the melt of raw material is formed while rotating the raw material. It is also advantageous to form a $SrLaGaO_4$ monocrystal in an atmosphere containing decreased quantities of $H_2O$ vapor and $CO_2$ by Czochralski pulling method.

9 Claims, 3 Drawing Sheets

METHOD OF MANUFACTURING MONOCRYSTALS OF OXIDE

FIELD OF ART

This invention relates to a method of manufacturing monocrystals of oxide, and more particularly a method of manufacturing a substrate material for use in superconductor devices.

BACKGROUND ART

A phenomenon of superconduction is the most specific phenomenon among electro-magnetic characteristics manifested in substances, and development in various field of applications is greatly expected for the utilization of a perfect conductivity, a perfect diamagnetic property and quantizing of magnetic flux.

Among electronic devices utilizing superconduction phenomena are included a high speed switch, a high sensitive detecting element, a high sensitive fluxmeter and many other electronic devices.

As a superconductor which has been widely used in conventional superconductor devices, $Nb_3Ge$ thin film formed on a substrate by using plasma sputtering technique may be mentioned. However, the critical temperature of $Nb_3Ge$ thin film is at most 23° K. Therefore, it can be used only within temperatures of liquid helium When liquid helium is used, however, cost for cooling and technological burden necessary to install a liquefying and cooling equipment of helium are increased. In addition, resource for helium is extremely limited. These problems hindered use of liquid helium in industrial field as well as for public welfare.

Various investigations have been made for obtaining superconductors having high critical temperatures. Remarkable progress has been made in recent investigations on oxide superconductor thin films. As a consequence, the critical temperature of superconductors becomes 77° K. or higher. Thus, the superconductors can operate by using inexpensive liquid nitrogen as cooling medium.

In conventional methods, such oxide superconductor films have been formed on a MgO monocrystal substrate or a $SrTiO_3$ monocrystal substrate heated to a high temperature by using sputtering or vapor deposition technique.

Among other monocrystals used as substrates, attentions have been paid to sapphire, YSZ, silicon, gallium arsenide, $LINO_3$, GGG, $LaGaO_3$, $LaALO_3$, etc.

In a conventional method of manufacturing superconductor thin films on a MgO monocrystalline substrate or a $SrTiO_2$ monocrystalline substrate, it is impossible to stably increase the superconduction critical current (Jc). Furthermore there is a problem that the superconduction critical temperature (Tc) is not stable.

To form excellent epitaxial films, the substrate material is required to satisfy the following conditions
(a) To have excellent lattice matching with a thin film crystal.
(b) No degradation of the film quality due to mutual diffusion at the time of epitaxially growing the film.
(c) To have a high melting temperature of at least higher than 1000° C., since the substrate material is heated to a high temperature.
(d) Monocrystals having excellent crystallization is available.
(e) To have electric insulating property.

As oxide superconductors having high critical temperatures, many oxides have been reported such as oxide thin films of $LnBa_2Cu_3O_{7-x}$ ($x=0-1$, Ln: Yb, Er,Y,Ho, Gd, Eu, Dy) Bi-Sr-Ca-Cu-O and oxide thin films of Tl-Ba-Ca-Cu-O.

The lattice constants a and b of these oxides are all included in a range of 3.76−3.92 Å. By rotating the coordinate system by 45 degrees, $\sqrt{2}\cdot a$ and $\sqrt{2}\cdot b$ can also be deemed as fundamental lattice, in which the lattice constants a and b are expressed by 5.32−5.54 Å.

For magnesium oxide (MgO) presently used widely as a substrate material, a=4.203 Å and the difference in the lattice constants reaches 7-11%, so that it has been extremely difficult to obtain excellent epitaxially grown films. This problem has also occurred for sapphire YSZ, silicon, gallium arsenide, $LiNbO_3$ and GGG.

When compared with MgO, $SrTiO_3$ has a small difference of 0.4-4% in the lattice constant from the oxide superconductor thin film as well as an excellent lattice matching property. At present, however, $SrTiO_3$ can be prepared only by Bernoulli method, and its crystal property is very poor so that only crystals having an etch pit density of larger than $10^5/cm^2$ can be obtained. Accordingly, it is difficult to form an excellent epitaxially grown film on such substrate having poor crystal quality. Furthermore, it has been impossible to find a substrate of large size.

$LaGaO_3$ monocrystal has a lattice constants of a=5.496 Å and b=5.554 Å. This would ensure a good lattice matching with an oxide superconductor. However, phase transition occurs at about 150° C., so that there is a problem of twinning in the crystal. Accordingly, when actually using $LaGaO_3$ monocrystal as a substrate of a superconductor film, it is necessary to remove twin crystals.

$LaAlO_3$ monocrystal has lattice constants a=b=3.788 Å and a good lattice matching with an oxide superconductor can be expected. However, since the melting point of the $LaALO_3$ monocrystal is very high of about 2100° C., it is extremely difficult to manufacture such monocrystal. In addition, such monocrystal likely to contains twin crystals.

As described above, the conventional materials which have been used as a substrate for forming a superconductive film do not satisfy the above-described conditions such as good lattice matching property with the superconductive film and easy availability. Consequently it has been difficult to manufacture stable superconductor devices.

As a result of various experiments, the inventors have proposed a monocrystal substrate material capable of forming an epitaxially grown superconductor film, that is, a strontium lanthanum gallium oxide monocrystal substrate having $K_2NiF_4$ type crystal structure as shown below. The inventors have presented a method of forming an oxide superconductive film on this substrate with epitaxial growing method (Japanese Patent Application No. 63-323739).

$$Sr_{1-x}La_{1-y}Ga-3O_{4-w}$$

($-0.05<x<0.05$, $-0.05<y<0.05$; $-0.05<z<6.05$, $-0.2<w<0.2$)

The difference in the lattice constants of $SrLaGaO_4$ monocrystal and an oxide superconductive film is extremely small, that is $-1.6-2.6\%$. Their crystal structures are extremely similar to each other. Furthermore, the lattice matching between the SrLaGaO$_4$ monocrystal and an oxide superconductive film is excellent. In other words, both SrLaGaO$_4$ monocrystal and the oxide superconductive film satisfy every required conditions described above. However, in the manufacture of SrLaGaO$_4$ monocrystal, such problems as cracks, subgrains, cells, etc. are liable to occur so that it has been impossible to manufacture monocrystals at high efficiencies.

SUMMARY OF THE INVENTION

Accordingly, it is an object of this invention to provide an improved method of manufacturing SrLaGaO$_4$ at a high efficiency without accompanying such troubles as cracks subgrains and cells.

According to the method of this invention, SrLaGaO$_4$ expressed by the following formula is used as a melt of raw material and a monocrystal is formed by the Czochralski pulling method $$Sr_xLa_yGa_zO_w.$$

where $$z \geq x, y \geq x \, 0.28 \leq x \leq 0.325$$

$$x+y+z=1$$

$$w=(2x-3y-3z)/2.$$

Preferably, a melt of raw material is formed while rotating the raw material. Further, it is advisable to form SrLaGaO$_4$ monocrystal in an atmosphere in which the amount of steam (H$_2$O) and carbon dioxide (CO$_2$) are reduced.

The inventors have made a number of researches regarding monocrystalization of SrLaGaO$_4$. Knowing the fact that, where crystals are grown from SrLaGaO$_4$ in the molten state cell, grown phase of LaSr$_2$GaO$_5$ is contained so as to decrease the yield, the inventors have investigated the quasi two dimensional state diagram of 2SrO-La$_2$O$_3$-Ga$_2$O$_3$ and obtained a cut state diagram as shown in FIG. 1. As a consequence, it was found that, for the purpose of avoiding the entering of LaSr$_2$GaO$_5$ into the SrLaGaO$_4$ monocrystal, it is necessary to shift the composition of a melt of raw material to a composition containing lesser quantity of Sr. This invention is based on this fact. Thus, in the three dimensional state diagram of 2SrO-La$_2$O$_3$-Ga$_2$O$_3$ as shown in FIG. 2, the composition of the melt of raw material is shifted toward the composition containing less quantity of Sr. In other words, in this invention, Sr$_x$La$_y$Ga$_z$O$_w$ is used as a melt of raw material to obtain an excellent SrLaGaO$_4$ monocrystal free from any LaSr$_2$GaO$_5$ cell. where $$z \geq x, y \geq x \text{ and } 0.28 \leq x \leq 0.325$$

$$x+y+z=1$$

$$w=(2x-3y-3z)/2.$$

As a result of many experiments, it was also found that the melt of raw material for growing SrLaGaO$_4$ crystals has characteristics different from a melt of usual oxide.

More particularly, the melt of raw material for growing SrLaGaO$_4$ crystals has a tendency that the center of convection flow current deviates from the center of the crucible. When the convection center deviates and becomes asynmetrical, a very large strain is liable to occur in the crystal, and the control of the crystal growth becomes difficult. It is considered that this deviation of the center of the convection flow and asymmetry are caused by the fact that since the flow speed of the convection flow is low and since the driving force of the convection flow itself is lower than that of the molten body of oxides, solid substances at the time of melting the raw materials have a tendency of being fixed at the center of the convection flow due to precipitation.

As a typical example, in a crucible having an inner diameter of 76 mm, the center of the convection flow is formed in an area within 20 mm from the center of the crucible. It is formed at a different position for each melting. When the center of the convection flow deviates more than 5 mm, the grow of the crystal becomes extremely difficult.

Noting this fact, according to the method of this invention, melting of raw materials is performed while the crucible is being rotated so as to make coincide with each other the center of the convection flow and the center of the crucible. As a result, when the rotation of the crucible is stopped, the center of the convection flow is stable, that is, in coincidence with the center of the crucible so that crystal growth can be made under an extremely stable condition.

It was also found that, at a high temperature, the SrLaGaO$_4$ crystal reacts with steam and carbon dioxide to form a denatured layer on the surface of the crystal which contributes to the formation of subgrains and growth of cells. This reaction is especially active at a temperature above 800° C. and forms a film of red brown color. The result of analysis of the composition shows that this film has a composition of: Sr: 18.2 at %, La: 11.2 at %, Ga: 2.4 at %, and 0: 68.2 at %. The result of X ray diffraction test showed that the film has a polyphase structure which cannot be fixed.

When a denatured layer is formed on the surface of the crystal due to reactions with steam and carbon dioxide, not only subgrains are formed but also cells grow. In addition, even before seeding, a film of polyphase structure is formed on the surface which makes difficult to conduct seeding.

In view of these defects, according to this invention, seed crystals are pulled up in an atmosphere containing a small quantities of steam H$_2$O and carbon dioxide CO$_2$. Then it becomes possible to stably obtain SrLaGaO$_4$ monocrystal. Especially, when the volume ratio of the steam is made to be less than 500 ppm, and when the volume ratio of carbon dioxide is made to be less than 50 ppm, high quality SrLaGaO$_4$ monocrystal could be formed.

BRIEF DESCRIPTIONS OF THE DRAWINGS

In the accompanying drawings.

DESCRIPTION OF THE PREFERRED EMBODIMENTS

Figure 1:
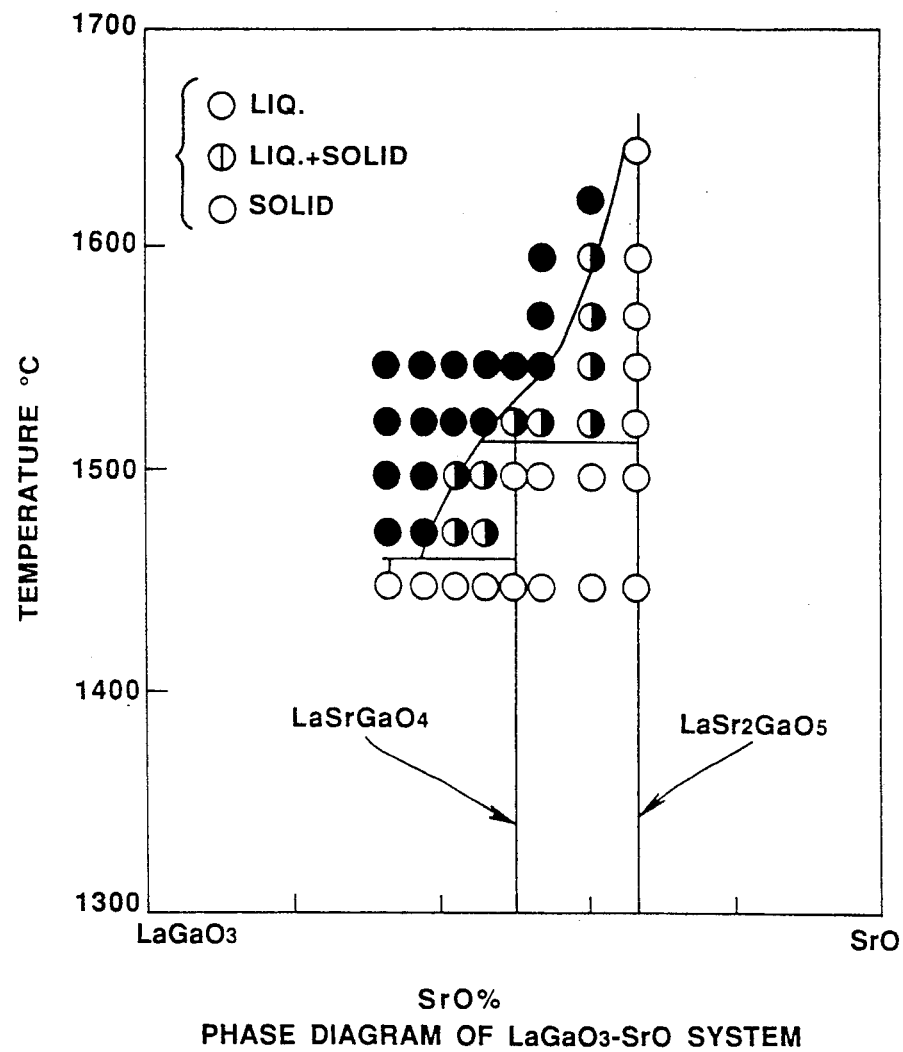
FIG. 1 is a quasi two dimensional state diagram of 2SrO-La$_2$O$_3$-Ga$_2$O$_3$ manufactured by the method of this invention.
Figure 2:
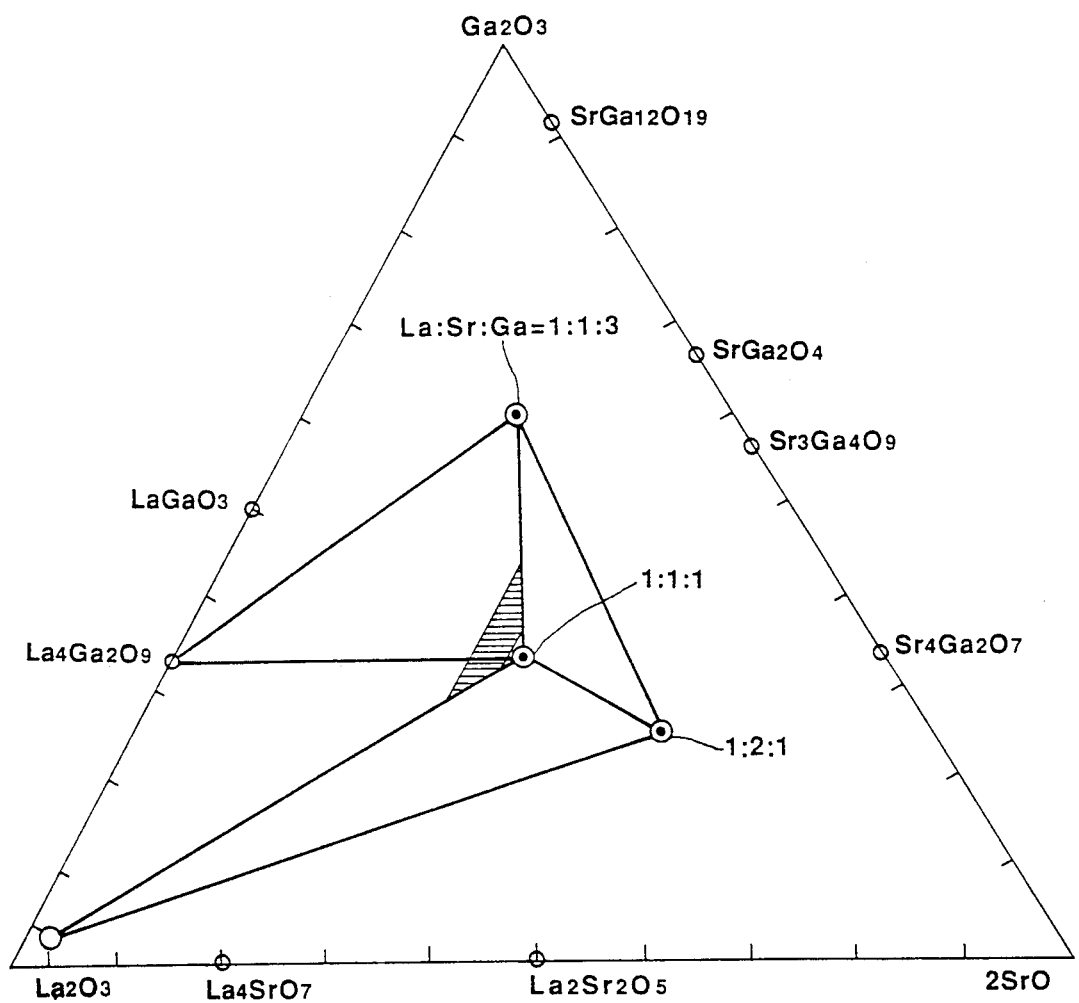
FIG. 2 is a three dimensional state diagram of LaGaO$_3$-SRO.

Some preferred embodiments of the method of this invention will now be described with reference to the accompanying drawings.

Embodiment 1

Powders of $SrCO_3$, $La_2O_3$ and $Ga_2O_3$ were used as starting materials. These powders were mixed together at a ratio of Sr:La:Ga = 0.94:0.96:1.10 and the mixture was calcined at a temperature of 1000° C. for effecting decarboxylation. Then the calcined mixture was pulverized and the resulting powder was pressed.

The pressed body thus obtained was sintered at a temperature of 1300° C. in the atmosphere to obtain about 1450 g of sintered $SrLaGaO_4$.

This sintered body was placed in a platinum crucible having an outer diameter of about 80 mm, a height of about 80 mm and a wall thickness of 2 mm and then the sintered body was melted with high frequency heating. Since pure platinum deforms greatly at the time of use, it is advantageous to use a platinum crucible reinforced with zirconia being dispersed thereinto.

A seed crystal of [100] orientation was prepared by using the sintered $SrLaGaO_4$ and a monocrystal of $SrLaGaO_4$ was grown by pulling the seed crystal with Czochralski pulling method.

At the first time, a [100] monocrystal of $SrTiO_3$ was used as the seed crystal. After a monocrystal of $SrLaGaO_4$ has been obtained, this monocrystal having a [100] orientation was used as the seed crystal. The pulling conditions were: pulling speed: 1 mm/Hr, crystal rotating speed of 25 rpm whereby a [100] orientation monocrystal having a diameter of 30 mm and a length of 70 mm was obtained.

The resulting $SrLaGaO_4$ monocrystal was sliced to obtain substrates to be used for forming superconductive thin films.

In the monocrystal thus obtained, no cell has grown and there is no heterogeneous substances admixed with the cell. In other words, the monocrystal thus obtained was extremely excellent.

Similar growth was effected with different mol ratio of Sr:La:Ga. This result is shown in the following Table I in which only the mol ratio of Sr:La:Ga was changed while other conditions unchanged.

Table I

| No. | | Mol Ratio Sr | La | Ga | Presence or absence of cell | Heterogeneous substances admixed with cell |
|---|---|---|---|---|---|---|
| 1 | Composition of this invention | 0.94 | 0.96 | 1.10 | None | None |
| 2 | | 0.93 | 1.035 | 1.035 | None | None |
| 3 | | 0.95 | 1.08 | 0.99 | None | None |
| 4 | | 0.97 | 1.015 | 1.015 | None | None |
| 5 | | 0.97 | 1.03 | 1.00 | None | None |
| 6 | Compositions other than this invention | 0.93 | 0.87 | 1.20 | Presence | $LaSr_2GaO_5$ |
| 7 | | 0.93 | 1.20 | 0.87 | " | $LaSr_2GaO_5$ $La_2O_3$ |
| 8 | | 0.80 | 1.10 | 1.10 | " | $LaSrGa_3O_7$ $La_4Ga_2O_9$ |
| 9 | | 1.00 | 1.05 | 0.95 | " | $LaSr_2GaO_5$ |
| 10 | | 0.98 | 1.01 | 1.01 | " | $LaSr_2GaO_5$ |
| 11 | | 1.00 | 1.00 | 1.00 | " | $LaSr_2GaO_5$ |

As can be noted from Table I, where a melt of raw materials Sr:La:Ga having a mol ration $Sr_xLa_yGa_zO_w$ is used, where $$z \geq x, y \geq x \text{ and } 0.28 \leq x \leq 0.325$$

$$x + y + z = 1$$

$$w = (2x + 3y + 3z)/2$$

an excellent $SrLaGaO_4$ monocrystal not containing $LaSr_2GaO_5$ cells can be obtained.

EXAMPLE 2

The second example of this invention is as follows.

In this example, the crucible was rotated for forming molten raw material.

In the same manner as in Example 1, 1450 g of a sintered body having a mol ration $Sr_{0.93}La_{1.035}Ga_{1.035}O_{4.035}$ was prepared.

Figure 3:
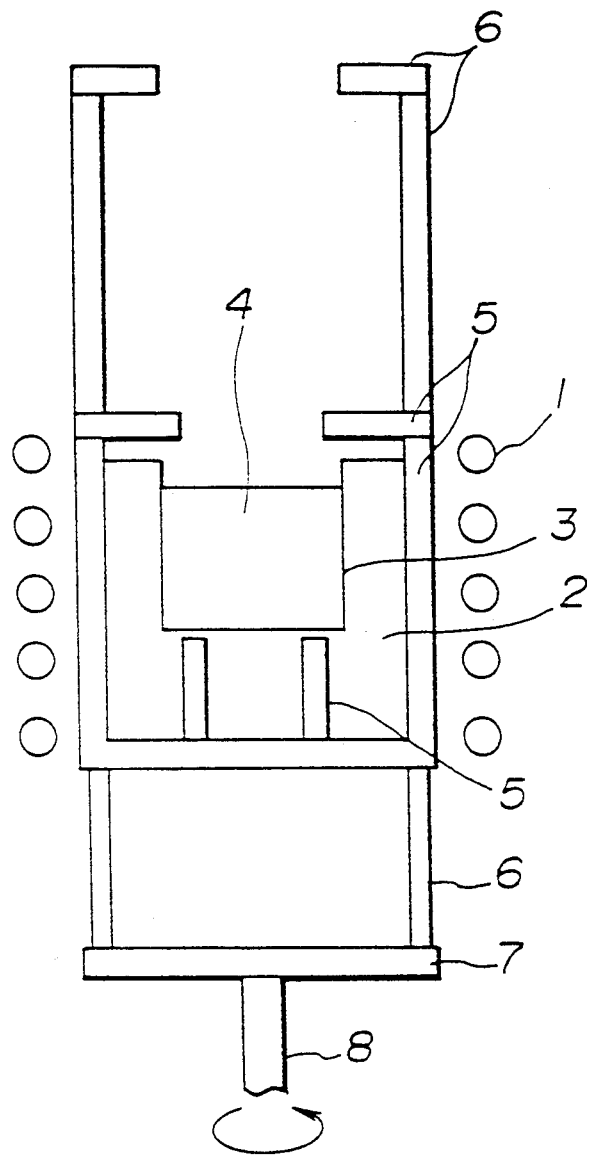
FIG. 3 is a front view showing the Czochralski's pulling device.

FIG. 3 is a front view of a Czochralski pulling device. This device comprises a melting portion As surrounded by a high frequency coil 1, a pulling portion B through which the pulling from the melting portion is performed and a rotating portion C for rotating the melting portion. In the melting portion A, the crucible 3 is disposed through a zirconia bubble layer. The crucible 3 contains a molten raw material $SrLaGaO_4$ 4. The container is made of zirconia refractries. The melting portion B is made of alumina refractries. A seed crystal is pulled up from the melting portion at a predetermined speed. In the rotating portion C, a rotatable table 7 is disposed on an alumina refractory member 6. The table 7 is rotatable by means of a shaft 8.

The crucible 3 is made of platinum and has an outer diameter of about 80 mm, a height of about 80 mm and a wall thickness of 2 mm. The crucible is rotated at a speed of 1.0 rpm by the shaft 8. In the crucible, the sintered body is melted by high frequency heating. $SrLaGaO_4$ monocrystal is grown by using a seed crystal having [100] orientation by Czochralski pulling method.

The seed crystal pulling conditions were made equal to those of Example 1. Thus, pulling speed was made to be 1 mm/Hr, the rotational speed of the crystal was made to be 25 rpm so as to obtain [100] orientation monocrystal of $SrLaGaO_4$ having a diameter of 30 mm and a length of 70 mm.

The $SrLaGaO_4$ thus obtained was free from any crack and exhibited an excellent crystal state.

For investigating the effect of different rotational speeds of the crucible, the numbers of revolutions thereof were changed to 0.1 rpm, 0.3 rpm and 1.0 rpm. The number of cracks of the monocrystals produced at these different speeds was measured. The result of measurement is shown in the following Table II in which the pulling was conducted five times at each experiment.

TABLE II

| rpm of crucible | Number of cracks generated |
|---|---|
| 0 (Stand still) | 4 |
| 0.1 | 3 |
| 0.2 | 1 |
| 0.3 | 0 |
| 1.0 | 0 |

As can be clearly noted from Table II, when the number of revolutions of the crucible is equal to or less than 0.2 rpm, the number of cracks generated is large, whereas when the number of revolutions exceeds 2 rpm. The number of cracks generated decreases greatly.

The result of the measurement may be interpreted as follows. When the number of revolutions of the crucible is equal to or less than 0.2 rpm, the molten substance rotates integrally with the crucible so that it is impossible to coincide the convection flow center with the axis of rotating shaft, whereas when the number of revolutions exceeds 2 rpm, the convection flow center comes to coincide with the axis of the rotating shaft and even when the rotation is stopped, the convection flow center would be maintained in a state coincided with the axis of rotation.

The rotation can be continued during the entire period of pulling or can be continued until the convection flow center comes to coincide with the center of the crucible after the raw material is melted by heating and then stops the rotation.

Where he rotation is to be continued, it is essential to perfectly coincide with each other the axis of the crucible, the axis of the rotating shaft and a axis of the high frequency coil If these three axis do not coincide with each other, a temperature vibration will likely to occur in the melt so that excellent crystals cannot be obtained.

EXAMPLE 3

This example is characterized int hat in forming SrLaGaO4 monocrystals with Czochralsjki pulling method. an atmosphere containing less amounts of steam ($H_2O$) and carbon dioxide ($CO_2$) is used.

More particularly, in a mixture of gas consisting of ¼ volume ration of $O_2/N_2$, a gas containing 10 ppm of $H_2O$ and 5 ppm of $H_2O$ and $CO_2$ is sent at a rate of litters/minute. Under these conditions, monocrystal was pulled up with other conditions maintained to be the same as Example 1.

More particularly, 1450 g of a sintered body having a composition ratio of $Sr_{0.93} La_{1.035} Ga_{1.035} O_{4.035}$ was prepared in the same manner as in Examples 1 and 2, and this sintered body was put into a platinum crucible having an outer diameter of about 80 mm, a wall thickness of 2 mm, and a height of about 80 mm. While rotating the crucible at a speed of 1.0 rpm, the sintered body was melted by high frequency heating A SrLaGaO4 monocrystal was grown by Czochralski pulling method using a seed crystal having a [100] orientation.

The pulling conditions of the crystal are the same as those of Example 1. That is, by using a pulling speed of 1 mm/hour and nubmer of rotations of ht crystal of 25 rpm, [100] orientation monocrystal having a diameter of 30 mm, an a length of 70 mm was obtained.

As above described defect free excellent φ SrLaGaO4 was obtained at a high efficiency.

For investigating the effect of volume ratio of $H_2O$ and $CO_2$ in the atmosphere, the volume ratio of $H_2O$ and $CO_2$ in the atmosphere was varied and a monocrystal was grown in the modified atmosphere. The surface state at the initial stage of growth and the surface state after completion of growth were measured. The surface state at the initial state was measured by placing SrLaGaO4 monocrystal in an electric furnace. The monocrystal was maintained for 6 hours at a temperature of 1450° C. immediately below the epitaxially growing temperature. After cooling of the monocrystal, presence and absence of a film on the surface of the crystal was measured with an optical microscope and X ray diffraction method. The results of measurements are shown in Tables III and IV, in which Table III shows the formation of subgrains after growth and the generation of cracks, while Table IV shows the result of measurement of the surface state at the initial state of growth.

TABLE III

| Reaction film No. | Volume ratio $H_2O$ | $CO_2$ | Formation of subgrains | Generation of cracks |
|---|---|---|---|---|
| 1 | 10 | 5 | NONE | NONE |
| 2 | 500 | 5 | " | " |
| 3 | 1000 | 5 | YES | YES |
| 4 | 10 | 50 | NONE | NONE |
| 5 | 500 | 50 | NONE | NONE |
| 6 | 1000 | 50 | NONE | YES |
| 7 | 10 | 100 | YES | YES |
| 8 | 500 | 100 | YES | YES |
| 9 | 1000 | 100 | YES | YES |

TABLE IV

| No. | Volume ratio $H_2O$ | $CO_2$ | Reaction film |
|---|---|---|---|
| 1 | 10 | 5 | NONE |
| 2 | 500 | 5 | NONE |
| 3 | 1000 | 5 | PRESENCE |
| 4 | 10 | 50 | NONE |
| 5 | 500 | 50 | NONE |
| 6 | 1000 | 50 | PRESENCE |
| 7 | 10 | 100 | PRESENCE |
| 8 | 500 | 100 | PRESENCE |
| 9 | 1000 | 100 | PRESENCE |

As can be clearly noted from Tables III and IV, where the volume ratio of $H_2O$ is made to be equal to or less than 500 ppm and that of $CO_2$ is made to be equal to or less than 50 ppm, no reaction film is formed on the surface and there was no formation of subgrain and crack. Thus, excellent crystals free from any subgrain and crack could be formed at a high efficiency. Where the volume ratio of $H_2O$ exceeds 500 ppm or where that of $CO_2$ exceeds 50 ppm, a reaction film was formed on the crystal and after completion of the crystal growth subgrains or cracks were formed. From these results, it can be noted that where monocrystals are grown in an atmosphere wherein the volume ratios of $H_2O$ and $CO_2$ are decreased, it is possible to obtain defect free excellent monocrystals at a high efficiency.

APPLICABILITY OF INDUSTRY

As above described, according to this invention, a melt of raw material to be expressed below is used and a monocrystal is formed by Czochralski pulling method, and excellent SrLaGaO4 monocrystals can be obtained at a high efficiency.

$$Sr_x La_y Ga_z O_w$$

where $$z \geq x, \ y \geq x \text{ and } 0.28 \leq x \leq 0.325$$

$$x + y + z = 1$$

$$w = (2x + 3y + 3z)/2$$

I claim:

1. A method of manufacturing a strontium-lanthanum-gallium oxide type monocrystal having a $K_2NiF_4$ type crystal structure, said crystal being grown by pulling the seed crystal by the Czochralski pulling, method characterized by:

a melting step of filling a crucible with a raw material and heating the crucible to melt the raw material so as to obtain a melt of the raw material having a composition to be described below; and a pulling step of dipping a seed crystal in said melt of raw material and pulling up said seed crystal so as to obtain a strontium-lanthanide-gallium oxide monocrystal of the formula:

$$Sr_xLa_yGa_zO_w$$

where $$z \geq x, y \geq x \text{ and } 0.28 \leq x \leq 0.325$$

$$x+y-z=1$$

$$w=(2x+3y+3z)/2.$$

2. The method according to claim 1 wherein said raw material is melted while being rotated.

3. The method according to claim 1 wherein said seed crystal is pulled up in an atmosphere containing deceased quantities of $H_2O$ vapor and $CO_2$.

4. The method according to claim 1 wherein said seed crystal has a [100] orientation.

5. The method according to claim 1 wherein said raw material is melted by high frequency heating while being rotated.

6. The method according to claim 5 wherein said raw material is melted while an axis of said crucible filled with said raw material is exactly coincided with the axis of a high frequency heating coil.

7. The method according to claim 1 wherein rotation of the molten raw material is continued during the entire period of the pulling of the seed crystal.

8. The method according to claim 1 wherein said melting step comprises an initial heating step in which the crucible is continued to rotate until an axis of convection flow comes to coincide with an axis of said crucible and a subsequent heating step of heating the raw material after the rotation is stopped.

9. A method of manufacturing a strontium-lanthanum-gallium oxide type monocrystal having a $K_2NiF_4$ type crystal structure, said crystal being grown by pulling the seed crystal by the Czochralski pulling method, characterized by:

a melting step of filling a crucible with a raw material, rotating said crucible and heating the rotating crucible to melt the raw material so as to obtain a melt of the raw material having a composition to be described below; and a pulling step of dipping a seed crystal in said melt of raw material and pulling up said seed crystal so as to obtain a strontium-lanthanide-gallium oxide monocrystal of the formula:

$$Sr_xLa_yGa_zO_w$$

where $$z \geq x, y \geq x \text{ and } 0.28 \leq x \leq 0.325$$

$$x+y-z=1$$

$$w=(2x+3y+3z)/2.$$

* * * * *